United States Patent [19]

Knickerbocker

[11] 4,390,230

[45] Jun. 28, 1983

[54] MODULAR BLOCK BASE AND BRACKET ASSEMBLY

[75] Inventor: Robert H. Knickerbocker, Cheshire, Conn.

[73] Assignee: The Siemon Company, Watertown, Conn.

[21] Appl. No.: 111,311

[22] Filed: Jan. 11, 1980

[51] Int. Cl.³ .............................................. H01R 9/02
[52] U.S. Cl. .......................... 339/125 R; 339/198 GA
[58] Field of Search ...................... 339/125 R, 198 GA

[56] References Cited

U.S. PATENT DOCUMENTS

| | | | |
|---|---|---|---|
| 3,518,618 | 6/1970 | Swanson | 339/125 R |
| 3,547,274 | 12/1970 | Sosinski | 339/198 GA |
| 3,559,813 | 2/1971 | Sosinski | 339/198 GA |
| 3,957,335 | 5/1976 | Troy | 339/125 R |

*Primary Examiner*—Joseph H. McGlynn
*Attorney, Agent, or Firm*—David S. Fishman

[57] ABSTRACT

A modular block, base and bracket assembly is presented for effecting electrical interconnections. The bracket is configured to receive one entire block and part of another block so that brackets can be mounted in series whereby three blocks can be mounted on two brackets.

9 Claims, 9 Drawing Figures

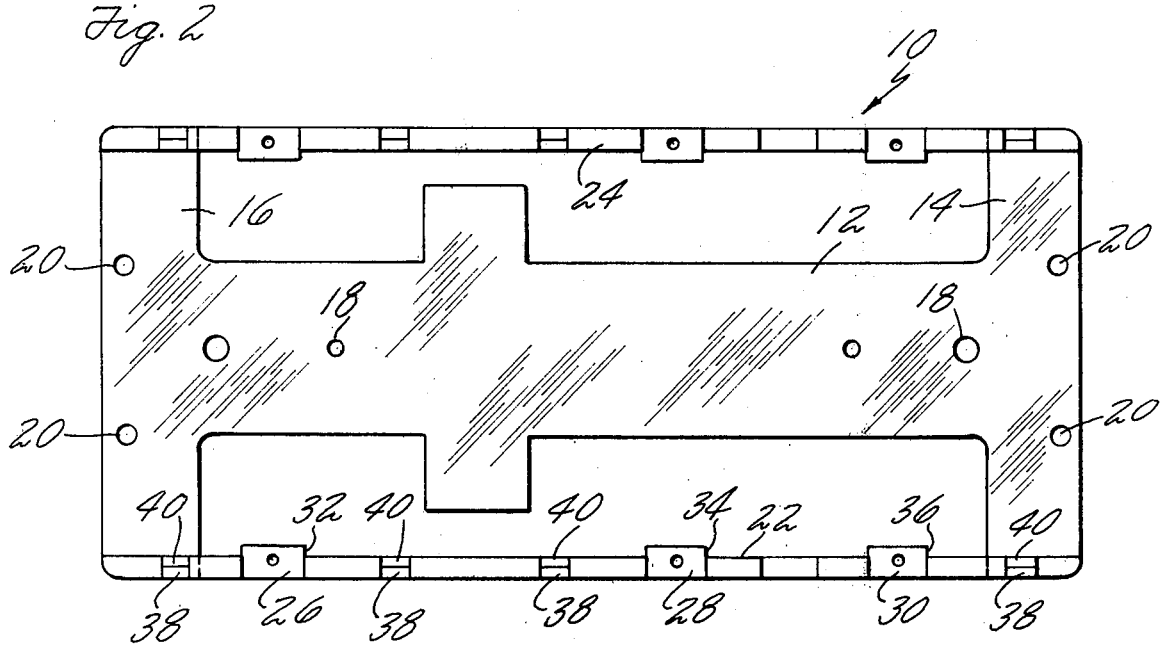
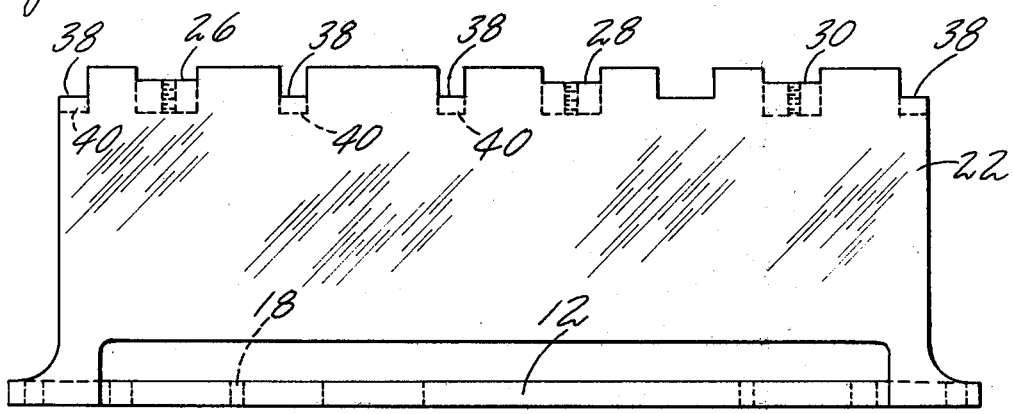

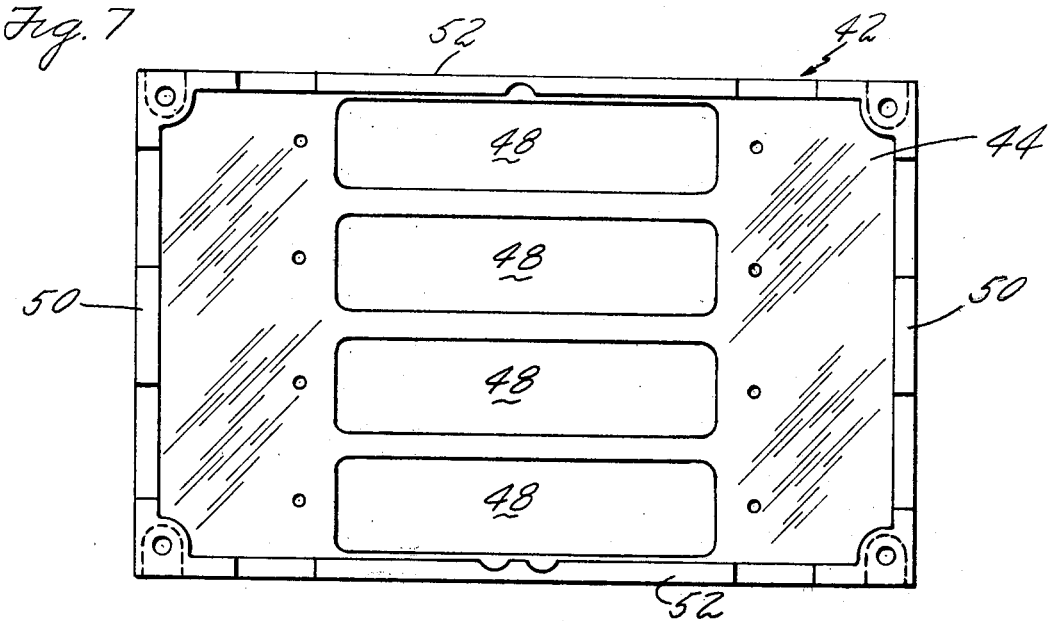
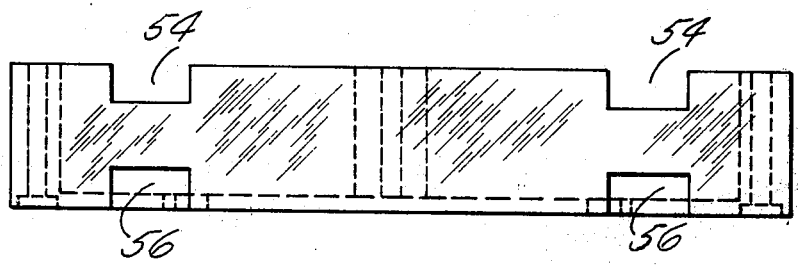
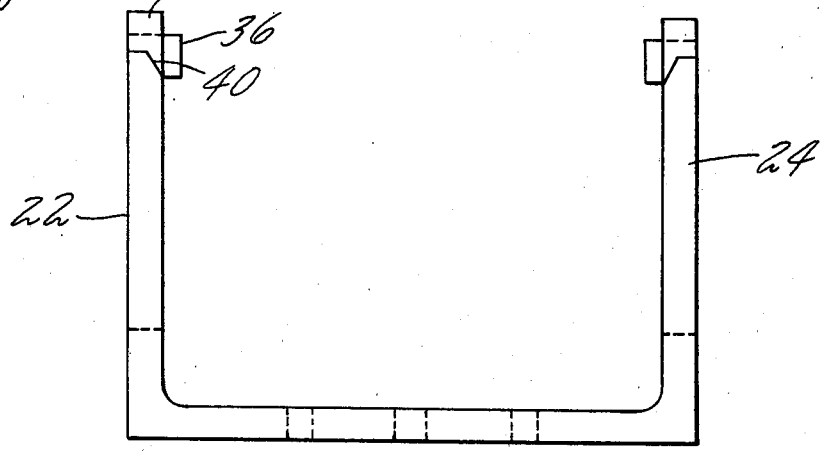

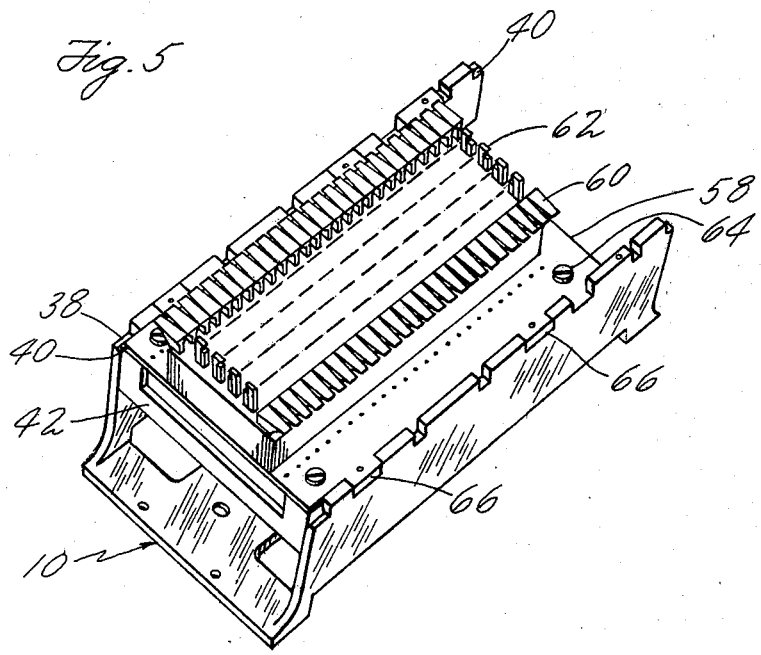
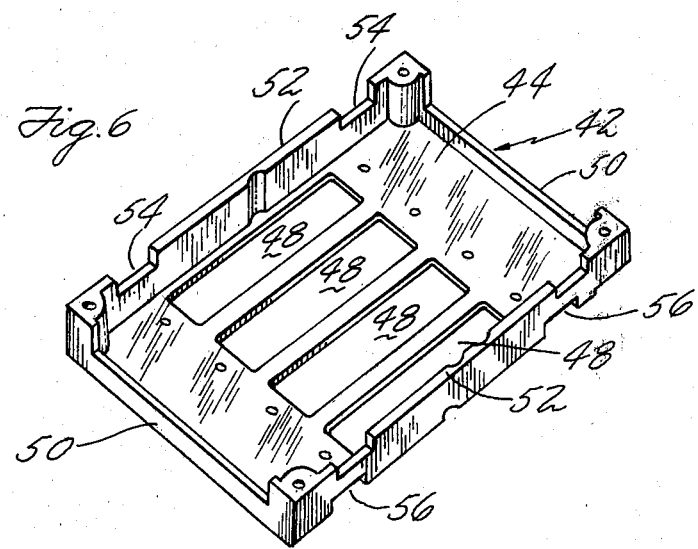

MODULAR BLOCK BASE AND BRACKET ASSEMBLY

BACKGROUND OF THE INVENTION

This invention relates to the field of terminal blocks, bases and brackets for electrical interconnection. More particularly, this invention relates to the field of terminal blocks and brackets used in effecting electrical interconnections in communications systems, particularly telephone communication systems.

Blocks, brackets, and block and bracket assemblies are, of course, well known in the telephone interconnect field. The typical approach is to design a bracket to either be wall mounted or to be mounted on a specific frame, and the bracket is typically designed to receive a single block. Greater flexibility of block and bracket arrangements is highly desirable.

SUMMARY OF THE INVENTION

The bracket of the present invention is configured so that it can be mounted on frames of several different telephone systems; and it also can be wall or grid mounted; and it can be mounted in a horizontal or vertical orientation. The bracket of the present invention is also configured so that it mounts one entire block plus part of another block. Accordingly, the brackets are arranged in linear arrays so that two adjacent brackets receive and mount three blocks, or more than three blocks depending on the size and configuration of the blocks.

BRIEF DESCRIPTION OF THE DRAWINGS

Referring now to the drawings, wherein like elements are numbered alike in the several FIGURES:

FIG. 2 is a top plan view of the bracket of FIG. 1;

FIG. 3 is a side elevation view of the bracket of FIG. 1;

FIG. 3a shows an end view of the bracket of FIGS. 2 and 3;

FIG. 5 shows details of a modular arrangement of block, mounting base and bracket;

FIG. 6 shows a mounting base for use with the bracket of the present invention;

FIG. 7 is a top plan view of the base of FIG. 6; and

FIG. 8 is a side elevation view of the base of FIG. 6.

DESCRIPTION OF THE PREFERRED EMBODIMENT

Figure 1:
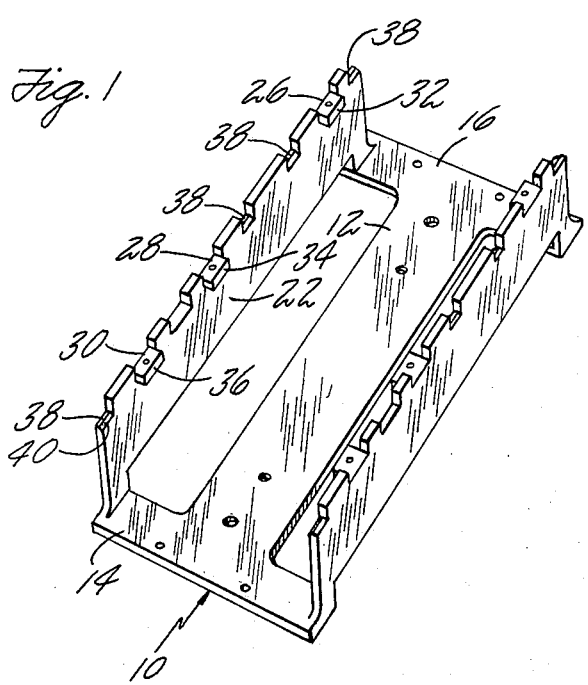
FIG. 1 is a perspective showing of the bracket of the present invention.

Referring first to FIGS. 1, 2, 3 and 3a, the mounting bracket 10 of the present invention has a mounting surface which is in the form of a "I" having a center strut 12 with end wings 14 and 16. Mounting holes 18 and 20 are formed in the center strut and end wings, respectively, so that bracket 10 can be mounted on a variety of standard mounting frames, such as Bell System mounting frames, independent telephone company mounting frames, or International Telephone and Telegraph "L" frames, or to walls or grids.

A pair of side walls 22 and 24 extend from the outer ends of the wings perpendicular to the plane of the mounting surface of bracket 10. These side walls are identical mirror images, so that details of only one wall will be described. The top surface of each side wall has a series of three recesses, 26, 28 and 30, each of which has a hole in the base to receive a threaded fastener for mounting of blocks. Tabs 32, 34 and 36 project inwardly from the side walls at each of the recesses 26, 28 and 30, and these tabs serve to lock into engagement with holes in a mounting base for a block (to be described hereinafter) to lock a mounting base to the bracket. Each side wall also has a series of four openings or notches 38, and each opening or notch 38 terminates in a bevelled surface 40 on the inner wall of the bracket. The openings or notches 38 and bevelled surfaces 40 serve to receive a screwdriver or similar instrument to wedge the side walls 22 outwardly to disassemble a mounting base from the bracket if it is desired to remove a mounting base and block from a previously assembled configuration of block, base and bracket.

Referring to FIGS. 6, 7 and 8, the mounting base 42 of the present invention is shown; and a base and block are shown mounted on the bracket 10 of the present invention in FIG. 5. The mounting base 42 has a bottom surface 44. The bottom surface 44 of the mounting base has a series of four generally rectangular openings 48 into which can be mounted and secured unitary connectors such as Amphenol connectors for prewired connection to connector elements such as "66" type clips in a block to be mounted. The mounting base 42 also has a pair of end walls 50 and a pair of side walls 52. Each side wall 52 has a pair of openings or notches 54, and each side wall also has a pair of bevelled recesses 56.

As shown in FIG. 5, a retainer plate 58 is fastened to the top of the mounting base, and the retainer cooperates with the openings or notches 54 to form locking notches for engagement with the tabs, such as tabs 32 and 34, of the bracket. The bevelled recesses 56 serve as camming surfaces. When the mounting base is inserted into the bracket to complete an assembly, such as shown in FIG. 5, the bevelled recesses 56 engage the tabs 32 and 34 to cam the side walls of the bracket outward so that the mounting base and block can be inserted into the bracket. As the mounting base moves further downward into the bracket, the tabs 32 and 34 on the side walls of the bracket then engage the opening 54 formed between the side walls of the mounting base and the retainer plate 58 to lock the base and block to the bracket.

Referring to FIG. 5, an assembly is shown where an "M" type block 60 having "66" type connectors 62 is shown mounted on a bracket of the present invention along with a base 42 of the present invention. Retainer plate 58 is mounted to bracket 60 by suitable fasteners in a manner known in the art to retain an array of connectors 62. Retainer plate 58 is mounted to mounting base 42 by screw fastener 64 at four corners of the retainer plate. Retainer plate 58 has four wings 66 (two on each side) which fit into the mating recesses 26 and 28 on the side walls of the mounting bracket. The wings 66 have through holes to receive threaded fasteners (not shown) which will be threaded into the holes in the bases of recesses 26 and 28 to lock the retainer plate to the mounting bracket. Thus, the assembly of the block 60, the retainer plate 48 and the mounting base 42 are secured to the bracket in two ways, i.e., by the screw fasteners which engage the wings of the retainer plate to the side walls of the bracket and by the tabs on the side walls of the bracket which engage the recesses 54 formed between the side walls of the base and the retainer plate. Also, it will be noted that a modular assembly of a retainer plate and block can be secured to the mounting bracket even if a mounting base is not present, since the screw fastener engagement between the wings of the mounting plate and the recesses of the bracket side walls effect a secure mechanical connection.

Figure 4:
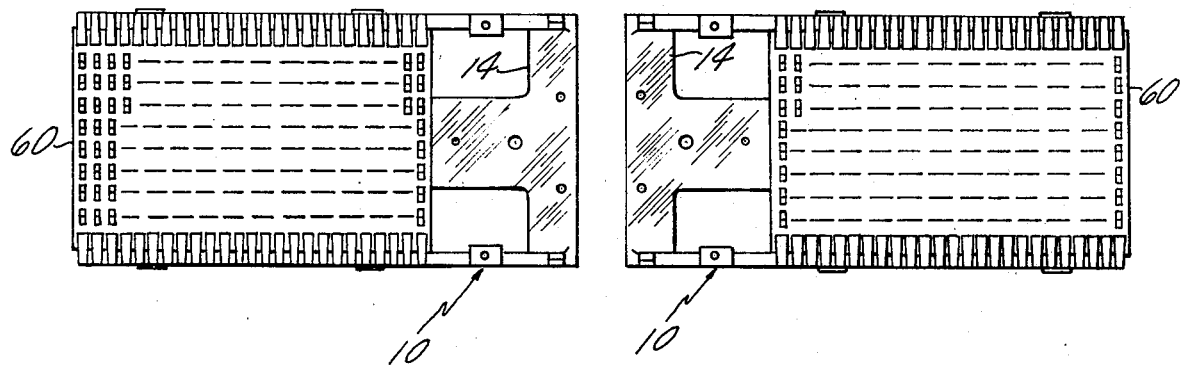
FIG. 4 shows a pair of brackets in an array, with blocks.

Referring now to FIG. 4, an illustration is shown of an array of the modular block and bracket structure of the present invention. FIG. 4 shows a pair of brackets 10 mounted in a horizontal linear array, with the left bracket having a block (shown as a larger block than that in FIG. 5) and retainer plate at the left end of the bracket, and the right bracket being shown with a similar mounting block and retainer plate at the right end of the bracket. As can best be seen in FIGS. 1, 2 and 3, the spacing between the recesses 26, 28 and 30 is not equal. Recess 28 is spaced relatively far from recess 26 and relatively close to recess 30. The spacing between recesses 26 and 28 is predetermined so as to be appropriate to receive the wings 66 of the retainer plate for use in this modular assembly. The two brackets shown in FIG. 4 are arrayed so that they are rotated 180° with respect to each other. That is, the recesses 30 of each bracket are positioned at the adjacent ends of the brackets when they are aligned in the array. Another mounting block and retainer plate assembly may then be positioned between the blocks shown in FIG. 4 so that the wings 66 of that third block and retainer plate assembly engage the recesses 30. In this way, three of the blocks may be mounted on two of the brackets, thus effecting considerable savings as well as ease of installation. In order to insure proper spacing between the adjacent brackets in the FIG. 4 configuration, an appropriate retainer plate may be mounted with its wings in the recesses 30 to provide a mounting template to determine the proper spacing between the brackets. Alternatively, a supplemental spacer may be placed between the brackets to set the spacing.

When unitary connectors are mounted in the openings 48 of mounting base 42, the connectorized cables (cable and hood connectors, not shown) which mates with the unitary connector will be in the space between center strut 12 of bracket 10 and the bottom of base 42. If the cables are mated to unitary connectors in the two center openings 48, strut 12 prevents any disengagement (accidental or otherwise) of the cable or hood from the unitary connector. In order to prevent disengagement of the cable and hood from unitary connectors mounted in the outer openings 48, a pair of wings 12(a) extend from strut 12. These wings will overlap the cable and hood mated to unitary connectors in the outer openings 48 of the base 42. The wings 12(a) are shown in FIG. 2.

While preferred embodiments have been shown and described, various modifications and substitutions may be made thereto without departing from the spirit and scope of the invention. Accordingly, it will be understood that the present invention has been described by way of illustration and not limitation.

What is claimed is:

1. A mounting bracket for terminal blocks, the bracket including:
   a rear mounting surface;
   a pair of spaced apart side walls extending from said mounting surface;
   three recesses in the top surface of each of said side walls, said recesses in each side wall being spaced apart unequally;
   three inwardly projecting tabs on each of said side walls; and
   a plurality of notches in each of said side walls, each of said notches terminating in a bevelled surface on the inner surface of the side wall.

2. A mounting bracket as in claim 1 wherein:
   each of said tabs is aligned with a recess.

3. A mounting bracket as in claim 1 wherein:
   said spaced recesses in each side wall form three opposed pairs of recesses;
   two of said opposed pairs of recesses are spaced to receive four mounting wings of one retainer plate; and
   the other pair of opposed recesses is spaced to receive two mounting wings of another retainer plate.

4. A modular assembly of a mounting bracket and a terminal block, the assembly including:
   a mounting bracket having a rear mounting surface;
   a pair of spaced apart side walls extending from said mounting surface;
   three recesses in the top surface of each of said side walls, said recesses in each side wall of said bracket being spaced apart unequally;
   three inwardly projecting tabs on each of said side walls;
   a plurality of notches in each of said side walls, each of said notches terminating in a bevelled surface on the inner surface of the side wall; and
   a retainer plate secured to said bracket, said retainer plate having four mounting wings engaging four of said spaced recesses.

5. A modular assembly of a mounting bracket and a terminal block, the assembly including:
   a mounting bracket having a rear mounting surface;
   a pair of spaced apart side walls extending from said mounting surface;
   three spaced recesses in the top surface of each of said side walls;
   a plurality of notches in each of said side walls, each of said notches terminating in a bevelled surface on the inner surface of the side wall;
   a retainer plate secured to said bracket, said retainer plate having four mounting wings engaging four of said recesses;
   a mounting base attached to said retainer plate, said mounting base having a bottom surface;
   a plurality of shaped openings in said bottom surface for receiving unitary connectors;
   a pair of spaced apart side walls;
   a pair of openings in each side wall, each of said openings being adapted to cooperate with said retainer plate to form a locking notch to secure said base to said mounting bracket; and
   a pair of bevelled surfaces at the bottom of each of said side walls, said bevelled surfaces serving as camming surfaces when mounting said base on said bracket.

6. A modular assembly as in claim 4 or 5 wherein:
   each of said tabs in each side wall of said bracket is aligned with a recess.

7. A modular assembly as in claim 6 wherein:
   said spaced recesses in each side wall of said bracket form three opposed pairs of recesses;
   two of said opposed pairs of recesses are spaced to receive four mounting wings of one said retainer plate; and
   the other pair of opposed recesses is spaced to receive two mounting wings of another retainer plate.

8. A mounting bracket for terminal blocks, the bracket including:
- a rear mounting surface by which the bracket may be affixed to a support structure, said rear mounting surface at least in part extending continuously between opposite ends of the bracket;
- a pair of spaced apart parallel side walls extending upwardly in the same direction from said mounting surface;
- three spaced recesses in the top surface of each of said side walls, said spaced recesses in each of said side walls forming three opposed pairs of recesses;
- a tab projecting inwardly toward the opposed side wall from the base of each of said side wall spaced recesses;
- a plurality of notches in each of said side walls, each of said notches having a base portion generally parallel to said rear mounting surface and a bevelled surface which terminates at the inner surface of the side wall;
- two of said opposed pairs of recesses being spaced to receive four mounting wings of one terminal block; and
- the other pair of opposed recesses being spaced to receive two mounting wings of another terminal block.

9. A modular assembly of a mounting bracket and a terminal block, the assembly including:
- a mounting bracket having a rear mounting surface by which the bracket may be affixed to a support structure, said rear mounting surface at least in part extending continuously between opposite ends of the bracket;
- a pair of spaced apart parallel side walls extending upwardly in the same direction from said mounting surfaces;
- three spaced recesses in the top surface of each of said side walls, said spaced recesses in each of said side walls forming three opposed pairs of recesses;
- a tab projecting inwardly toward the opposed side wall from the base of each of said side wall spaced recesses;
- a plurality of notches in each of said side walls, each of said notches having a base portion generally parallel to said rear mounting surface and a bevelled surface which terminates at the inner surface of the side wall;
- a terminal block secured to said bracket, said terminal block having four mounting wings engaging four of said spaced recesses;
- two of said opposed pairs of recesses being spaced to receive four mounting wings of one terminal block; and
- the other pair of opposed recesses being spaced to receive two mounting wings of another terminal block.

* * * * *